(12) United States Patent
Sugiyama et al.

(10) Patent No.: US 10,236,661 B2
(45) Date of Patent: Mar. 19, 2019

(54) WAVELENGTH VARIABLE LIGHT SOURCE

(71) Applicant: HAMAMATSU PHOTONICS K.K., Hamamatsu-shi, Shizuoka (JP)

(72) Inventors: Atsushi Sugiyama, Hamamatsu (JP); Tadataka Edamura, Hamamatsu (JP); Naota Akikusa, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 15/901,155

(22) Filed: Feb. 21, 2018

(65) Prior Publication Data

US 2018/0248338 A1 Aug. 30, 2018

(30) Foreign Application Priority Data

Feb. 24, 2017 (JP) .................................. 2017-033768

(51) Int. Cl.
| | |
|---|---|
| H01S 5/183 | (2006.01) |
| H01S 5/06 | (2006.01) |
| H01S 5/14 | (2006.01) |
| H01S 5/042 | (2006.01) |
| H01S 5/04 | (2006.01) |
| H01S 5/022 | (2006.01) |
| H01S 5/18 | (2006.01) |
| H01S 5/024 | (2006.01) |

(52) U.S. Cl.
CPC ........ *H01S 5/0607* (2013.01); *H01S 5/02296* (2013.01); *H01S 5/02469* (2013.01); *H01S 5/041* (2013.01); *H01S 5/0425* (2013.01); *H01S 5/143* (2013.01); *H01S 5/18* (2013.01); *H01S 5/183* (2013.01); *H01S 5/18366* (2013.01)

(58) Field of Classification Search
CPC ............. H01S 5/02296; H01S 5/18366; H01S 5/02212; H01S 5/041; H01S 5/02415
See application file for complete search history.

(56) References Cited

U.S. PATENT DOCUMENTS

| | | | |
|---|---|---|---|
| 2002/0031155 A1* | 3/2002 | Tayebati | .................. G01J 3/26 372/50.1 |
| 2014/0176958 A1* | 6/2014 | Flanders | ................. H01S 5/183 356/479 |

FOREIGN PATENT DOCUMENTS

| | | |
|---|---|---|
| JP | 2013-522920 A | 6/2013 |
| WO | WO-2011/116917 A1 | 9/2011 |

* cited by examiner

*Primary Examiner* — Michael Carter
(74) *Attorney, Agent, or Firm* — Drinker Biddle Reath LLP

(57) ABSTRACT

A wavelength variable light source includes a housing, a heat sink disposed in the housing, an excitation light source disposed on the heat sink and configured to output excitation light, a gain medium disposed on the heat sink and including an active layer and a lower DBR, a MEMS mechanism including a movable film facing the gain medium via a gap, disposed on the gain medium, and configured to control the gap, an upper DBR provided in the movable film and configuring a resonator together with the lower DBR, a reflector configured to reflect the excitation light output from the excitation light source toward the gain medium in the housing, and a window formed in the housing and configured to transmit light output from the gain medium.

4 Claims, 5 Drawing Sheets

WAVELENGTH VARIABLE LIGHT SOURCE

TECHNICAL FIELD

The present disclosure relates to a wavelength variable light source.

BACKGROUND

Vertical external cavity surface emitting lasers (VECSELs) have been proposed as high beam quality wavelength variable light sources operated at room temperature. For example, the VECSEL disclosed in Japanese Unexamined Patent Publication No. 2013-522920 includes an integrated unit in which a first configuration component including a first mirror having a mirror layer and a second configuration component including an active region having an active layer are connected. The VECSEL includes a second mirror that forms a resonator together with the first mirror. The VECSEL controls the resonator length, using a micro-optical electro-mechanical system technology, for example.

SUMMARY

When mounting a VECSEL as described above, the VECSEL may be accommodate in a housing. When the VECSEL is in the housing, such a VECSEL may not obtain stable laser oscillation due to heat generated by an excitation light source and the integrated unit. An example configuration includes the excitation light source, the first configuration component, the second configuration component, and the second mirror stacked in order in the housing. In the example configuration, even if the VECSEL is disposed on a heat sink for the purpose of eliminating the influence of heat generation, exhaust heat from the integrated unit is insufficient, and the second mirror stacked on the integrated unit may not be stably operated.

An object of the present disclosure is to provide a wavelength variable light source by which a thermal influence is suppressed and a stable operation is obtained.

A wavelength variable light source according to one aspect of the present disclosure includes a housing, a heat sink disposed in the housing, an excitation light source, a gain medium, a micro-electro-mechanical system (MEMS) mechanism, an upper distributed Bragg reflector (DBR), a reflector, and a window. The excitation light source is disposed on the heat sink and configured to output excitation light. The gain medium is disposed on the heat sink and including an active layer and a lower DBR. The MEMS mechanism includes a movable film facing the gain medium via a gap, the MEMS is disposed on the gain medium, and configured to control the gap. The upper DBR is provided on the movable film and configuring a resonator together with the lower DBR. The reflector is configured to reflect the excitation light output from the excitation light source toward the gain medium in the housing. The window is formed in the housing and configured to transmit light output from the gain medium.

In the wavelength variable light source, the excitation light output from the excitation light source is reflected at the reflector and is input to the gain medium. In the gain medium to which the excitation light is input, light is emitted from the active layer by the excitation light. The light is amplified by the resonator configured from the upper DBR and the lower DBR. The amplified light is output through the window to an outside. The resonator length is controlled by adjusting the gap with the MEMS mechanism. With the adjustment, the wavelength of the output light is controlled. In the wavelength variable light source, both the excitation light source and the gain medium are disposed on the heat sink. Consequently, not only the excitation light source but also the gain medium are directly cooled by the heat sink, and an influence of heat generation of the gain medium on the MEMS mechanism disposed on the gain medium is suppressed. Therefore, the thermal influence is suppressed, and a stable operation is obtained.

In one aspect of the present disclosure, the heat sink may have a first portion and a second portion separated from each other, the excitation light source may be disposed on the first portion, and the gain medium may be disposed on the second portion. According to this configuration, the temperature of the gain medium is independently stabilized without being influenced by the heat generation of the excitation light source. With the configuration, stable laser oscillation and wavelength sweeping are realized.

In one aspect of the present disclosure, the reflector may be configured from a multilayer film formed in the window, and the multilayer film may have wavelength selectivity to transmit the light output from the gain medium. In this configuration, the window in which the multilayer film is formed functions as the reflector, and thus there is no need to separately dispose a mirror or the like for reflecting the excitation light.

In one aspect of the present disclosure, the window may have an inclined surface inclined with respect to an optical axis of the excitation light output from the excitation light source, and the multilayer film may be formed on the inclined surface. In this configuration, the excitation light is reliably input to the gain medium by a simple method such as angle adjustment of the inclined surface.

In one aspect of the present disclosure, the excitation light source may be a photonic crystal surface emitting laser. Since spread of an emission angle of the photonic crystal surface emitting laser is small, there is no need to dispose a lens or the like for collecting the excitation light in the housing.

In one aspect of the present disclosure, the upper DBR may be formed on a surface of the movable film, the surface being at an opposite side of a surface facing the lower DBR. According to this configuration, a gap width between the gain medium and the upper DBR is freely designed without considering the thickness of the upper DBR.

DETAILED DESCRIPTION

Figure 1:
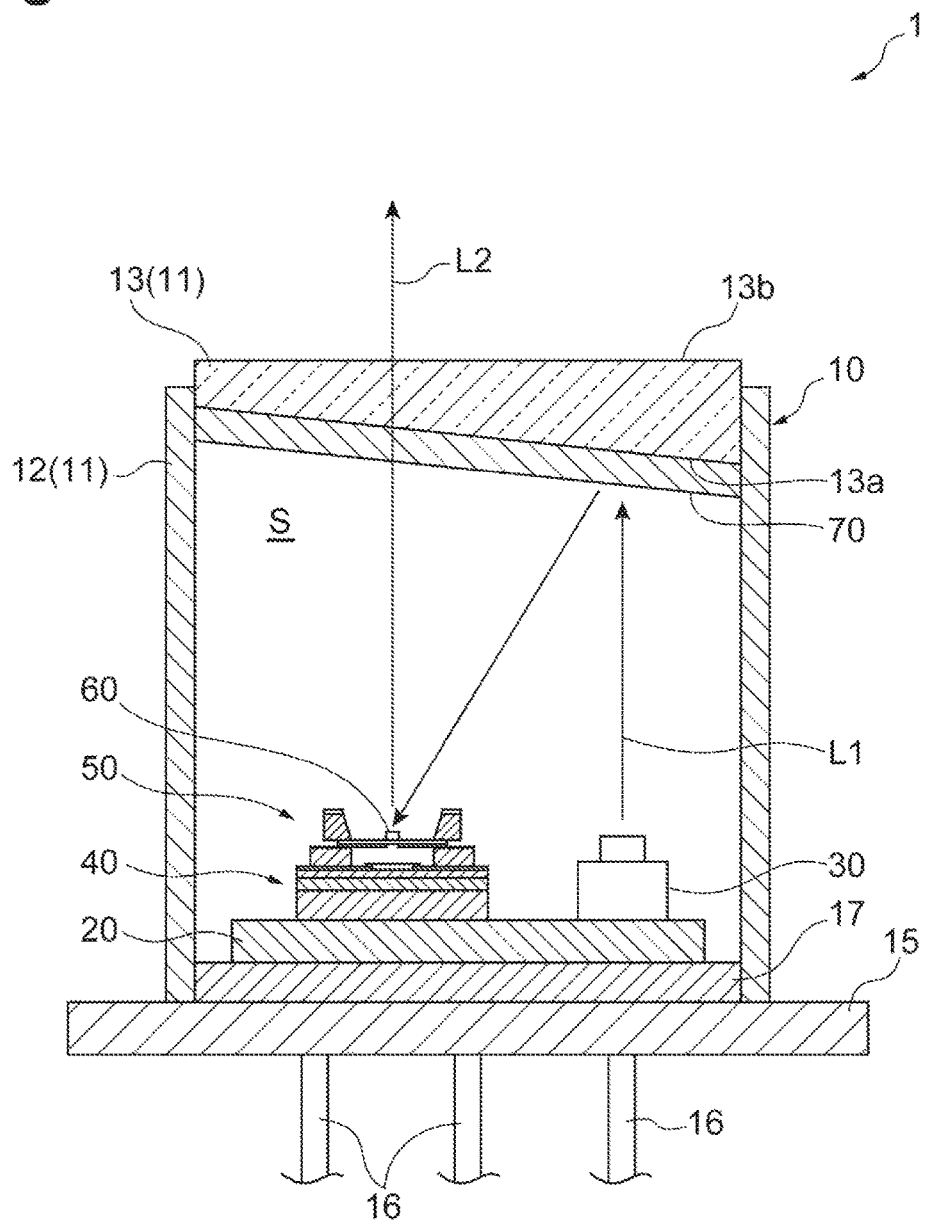
FIG. 1 is a schematic sectional view illustrating a wavelength variable light source according to a first embodiment.

Hereinafter, embodiments of the present disclosure will be specifically described with reference to the drawings. For the sake of convenience, substantially the same elements are denoted by the same reference numerals, and the description thereof may be omitted. In the present embodiments, as an example of a wavelength variable light source, a wavelength variable light source that outputs mid-infrared rays having a wavelength of about 2 to 20 μm will be described.

First Embodiment

Figure 2:
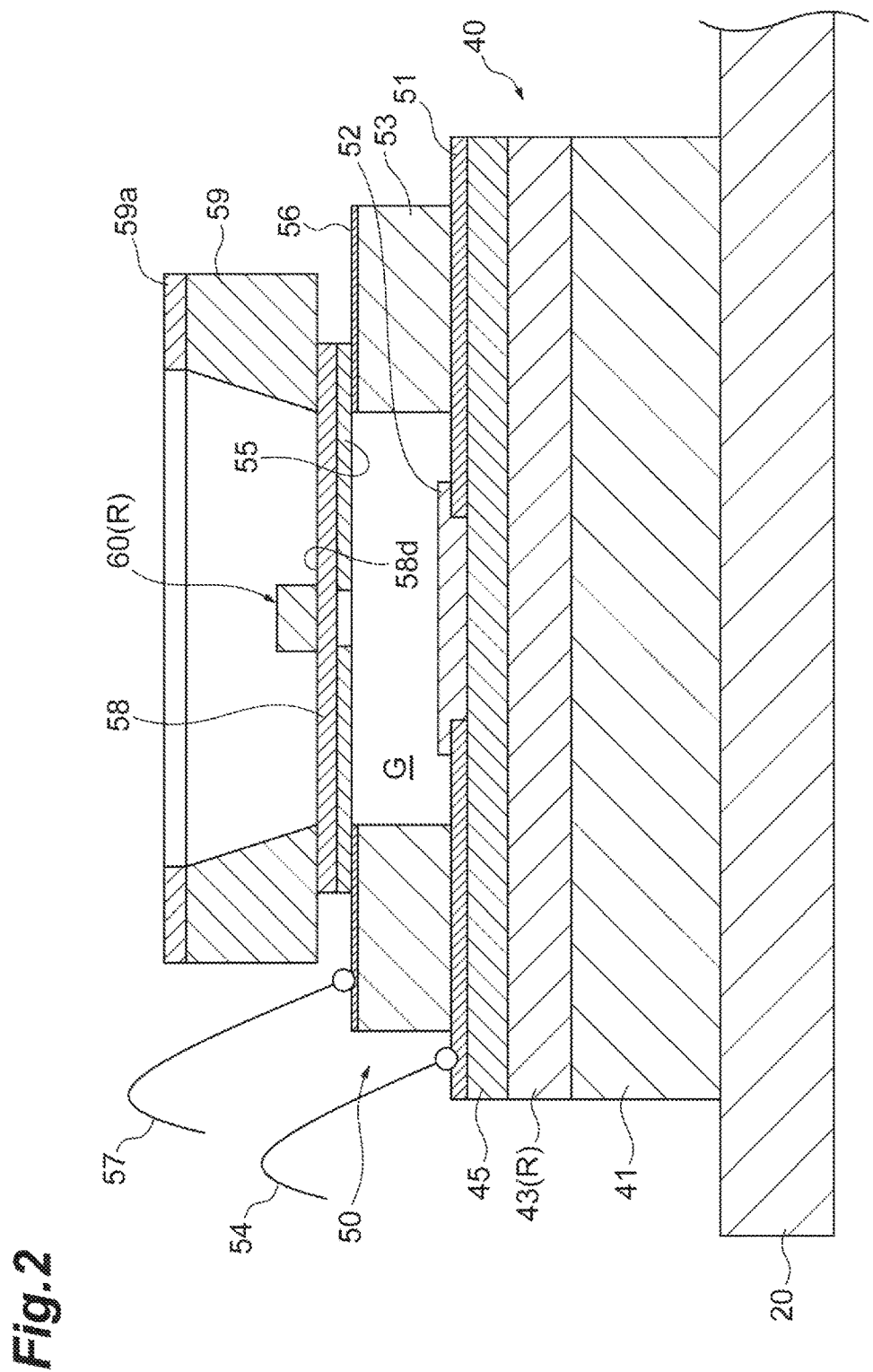
FIG. 2 is a partially enlarged view of the wavelength variable light source of FIG. 1.

FIG. 1 is a sectional view schematically illustrating a wavelength variable light source. FIG. 2 is a partially enlarged view of FIG. 1. As illustrated in FIG. 1, a wavelength variable light source 1 includes a housing 10, a heat sink 20, an excitation light source 30, a gain medium 40, a MEMS mechanism 50, an upper DBR 60, and a reflector 70. The housing 10 accommodates the heat sink 20, the excitation light source 30, the gain medium 40, the MEMS mechanism 50, the upper DBR 60, and the reflector 70 in a space S formed inside the housing 10. In the present embodiment, the housing 10 includes a cap 11 and a stem 15. As an example, the housing 10 may be a TO-8 package. The cap 11 includes a cylindrical portion 12 having a cylindrical shape and a window 13 that seals one end (upper end) of the cylindrical portion 12. The window 13 transmits light L2 output from the gain medium 40. For example, the window 13 is formed of a material such as glass, quartz, or Ge. As illustrated in FIG. 1, the window 13 has a wedge structure having an inclined surface 13a. That is, the window 13 includes the inclined surface 13a that is a plane inclined with respect to an axis of the cylindrical portion 12. The inclined surface 13a configures an inner surface of the window 13. An outer surface 13b of the window 13 is a plane orthogonal to the axis of the cylindrical portion 12.

The stem 15 has a disc shape having an outer diameter larger than the outer diameter of the cylindrical portion 12. The stem 15 seals the other end (lower end) of the cylindrical portion 12. The stem 15 is provided with a plurality of lead pins 16 made of a conductor. The plurality of lead pins 16 electrically connects an inside and an outside of the housing 10. That is, the plurality of lead pins 16 can supply electric power to each element in the housing 10.

The heat sink 20 is disposed on the stem 15 in the housing 10. In the present embodiment, a thermoelectric cooler (TEC) 17 is arranged on the stem 15, and the heat sink 20 is disposed on the TEC 17. The TEC 17 is operated by the electric power supplied from the lead pins 16 and can cool the heat sink 20. For example, the TEC 17 may have a rectangular plate shape, a disk shape, or the like. Similarly, the heat sink 20 may have a rectangular plate shape, a disk shape, or the like. In the illustrated example, the heat sink 20 has a smaller outer shape than the TEC 17.

The excitation light source 30 is disposed on the heat sink 20. In the present embodiment, the excitation light source 30 is a photonic crystal surface emitting laser, and outputs excitation light L1 that excites the gain medium 40. For example, the excitation light L1 of the photonic crystal surface emitting laser has a wavelength of about 940 nm. The excitation light source 30 is operated by the electric power supplied from the lead pins 16. An optical axis of the excitation light source 30 is along the axis of the cylindrical portion 12 in the housing 10. Therefore, the inclined surface 13a of the window 13 is inclined with respect to the optical axis of the excitation light source 30.

The gain medium 40 is disposed on the heat sink 20. That is, in the present embodiment, the excitation light source 30 and the gain medium 40 are disposed on one heat sink 20. As illustrated, the excitation light source 30 and the gain medium 40 are spaced apart from each other on the same plane. As illustrated in FIG. 2, the gain medium 40 has a substrate 41, a lower DBR 43 and an active layer 45. The lower DBR 43 and the active layer 45 are formed on the substrate 41. The gain medium 40 is disposed on the heat sink 20. the substrate 41 is disposed between the heat sink 20 and the lower DBR 43. The substrate 41 may be, for example, a GaSb substrate.

The lower DBR 43 has a structure in which a high refractive index material and a low refractive index material are alternately laminated. The lower DBR 43 reflects light having a predetermined wavelength output from the active layer 45. In the present embodiment, the lower DBR 43 selectively reflects light in a predetermined wavelength range. As an example, the lower DBR 43 reflects light in a wavelength range of about 2 to 2.5 μm. The lower DBR 43 is formed of a GaSb/AlAsSb multilayer film epitaxially grown on the substrate 41. Further, the active layer 45 is formed of a GaInAsSb quantum well active layer epitaxially grown on the lower DBR 43. In the active layer 45, the light L2 is emitted as the excitation light L1 is input. The light L2 has a wavelength reflected at the lower DBR 43 and the upper DBR 60.

The MEMS mechanism 50 has a fixed electrode 51 and a movable electrode 55 facing each other. The fixed electrode 51 is formed of a metal layer formed on a surface of the active layer 45. This metal layer is obtained by depositing Au/Ti, for example. In the present embodiment, the fixed electrode 51 is patterned to form a rectangular shape with the center open. The opening in the center of the fixed electrode 51 serves as an outlet of the light L2 output from the active layer 45. For example, a nonreflective coating 52 is formed in the opening. The nonreflective coating 52 may be a single film of SiN or $SiO_2$ or a multilayer film of $SiO_2/TiO_2$.

A gap control layer 53 is formed on the fixed electrode 51. The gap control layer 53 has a rectangular outer shape smaller than the fixed electrode 51 and has an opening larger than the opening of the fixed electrode 51. Therefore, a part of the fixed electrode 51 is exposed. A wire 54 connected to the lead pin 16 is fixed to the exposed portion of the fixed electrode 51. The gap control layer 53 may be, for example, a $SiO_2$ layer formed by TEOS-CVD. A metal layer 56 for electric conduction joined to the movable electrode 55 is patterned on the gap control layer 53.

Figure 3A:
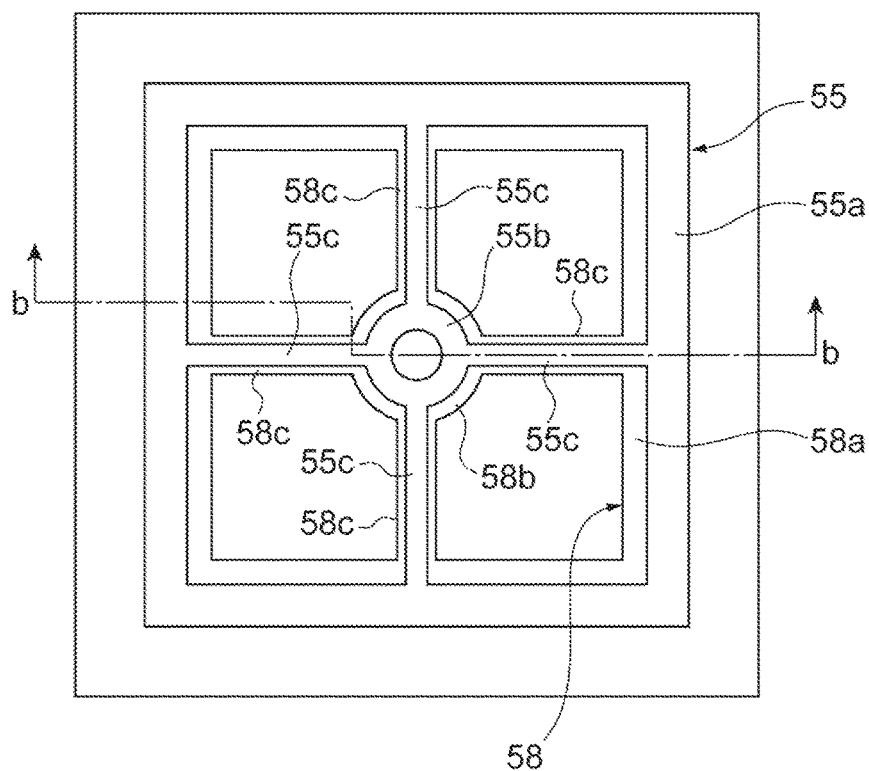
FIG. 3A is a view illustrating a movable electrode and an upper DBR in the wavelength variable light source of FIG. 1, and is a view of the movable electrode as viewed from below.
Figure 3B:
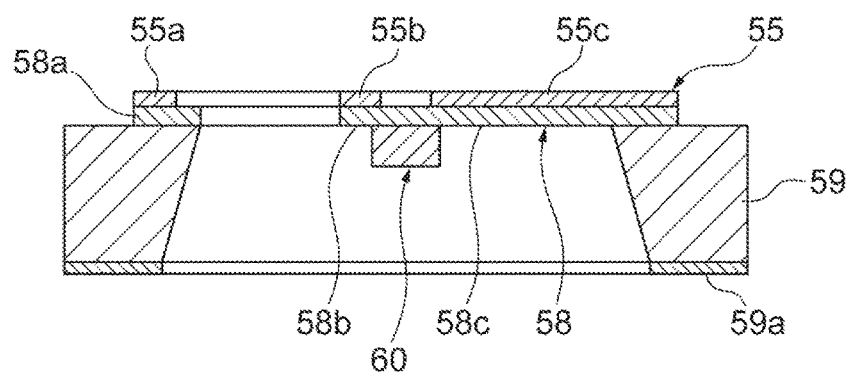
FIG. 3B is a sectional view taken along the line b-b of FIG. 3A.

The movable electrode 55 is disposed on the metal layer 56 to face the fixed electrode 51. A gap G is formed by the gap control layer 53 and the metal layer 56 between the plane including the movable electrode 55 and the plane including the fixed electrode 51. FIGS. 3A and 3B are views illustrating details of the movable electrode 55. FIG. 3A is a view of the movable electrode as viewed from below. FIG. 3B is a sectional view taken along the line b-b of FIG. 3A.

The movable electrode 55 has a frame portion 55a, a central portion 55b, and a plurality of connection portions 55c. The frame portion 55a has a rectangular frame shape and is joined to the metal layer 56. The frame portion 55a has a smaller outer shape than the metal layer 56. Therefore, a part of the metal layer 56 is exposed. A wire 57 connected to the lead pin 16 is fixed to the exposed portion of the metal layer 56 (see FIG. 2). That is, the movable electrode 55 is connected to the lead pin 16 via the metal layer 56. The central portion 55b is located in the center of the frame portion 55a and has an annular shape. The connection portion 55c connects the frame portion 55a and the central portion 55b. In the present embodiment, the connection portion 55c extends from the center of each edge of the frame portion 55a to the central portion 55b. A movable film 58 is disposed on the movable electrode 55. The movable film 58 moves together with the movable electrode 55.

The movable film 58 faces the lower DBR 43. The gap G is formed between the movable film 58 and the gain medium 40. The movable film 58 is formed of, for example, SiN that can be formed into a thick film and is stress-controllable. The movable film 58 may have a thickness of about 0.5 to 5 µm, for example. The movable film 58 has a frame portion 58a, a central portion 58b, and a plurality of connection portions 58c. The frame portion 58a has a rectangular frame shape and has an outer shape of the same size as the movable electrode 55. In addition, the width of the frame portion 58a is formed to be larger than the width of the frame portion 55a of the movable electrode 55. The central portion 58b is located in the center of the frame portion 58a and has a disc shape. The central portion 58b has an outer diameter larger than the outer diameter of the central portion 55b of the movable electrode 55. Further, the center of the central portion 58b coincides with the center of the central portion 55b of the movable electrode 55. The connection portion 58c connects the frame portion 58a and the central portion 58b. The connection portion 58c extends from the center of each edge of the frame portion 58a to the central portion 58b. The connection portion 58c has a width larger than the width of the connection portion 55c of the movable electrode 55.

In the illustrated example, the movable electrode 55 and the movable film 58 are formed by a semiconductor process, and thus a Si substrate 59 is disposed on an outer periphery of the movable film 58. An inner periphery of the rectangular frame-like Si substrate 59 is inclined inward toward a lower side. A mask layer 59a formed by SiN film formation is formed on the Si substrate 59.

The upper DBR 60 configures a resonator R together with the lower DBR 43. The upper DBR 60 is provided on the movable film 58. In the present embodiment, the upper DBR 60 is formed on a surface 58d in the central portion 58b of the movable film 58, the surface 58d being at an opposite side of a surface facing the lower DBR 43. The upper DBR 60 has wavelength selectivity to transmit the excitation light L1 and reflect the light L2. The upper DBR 60 has a structure in which a high refractive index material and a low refractive index material are alternately laminated. For example, the upper DBR 60 may be a $TiO_2/SiO_2$ multilayer film deposited on the movable film 58.

The reflector 70 reflects the excitation light L1 output from the excitation light source 30 toward the gain medium 40 in the housing 10. The excitation light L1 is reflected at the reflector 70 and transmits the upper DBR 60 and the movable film 58. The excitation light L1 passes through the opening of the central portion 55b in the movable electrode 55 and is input to the gain medium 40. In the present embodiment, the reflector 70 is formed of a multilayer film formed on the inclined surface 13a of the window 13. The multilayer film is formed on the entire surface of the inclined surface 13a. The multilayer film has wavelength selectivity to reflect the excitation light L1 and transmit the light L2 output from the gain medium 40. The multilayer film has a structure in which a high refractive index material and a low refractive index material are alternately laminated. The multilayer film may be a multilayer film of Ge and $Al_2O_3$, for example. Further, the multilayer film may be a multilayer film of, for example, Si and $Al_2O_3$.

In such a wavelength variable light source 1, the excitation light L1 output from the excitation light source 30 is reflected at the reflector 70 and is input to the gain medium 40. In the gain medium 40 to which the excitation light L1 is input, the light L2 is output from the active layer 45 by the excitation light L1. The light L2 is amplified by the resonator R configured from the upper DBR 60 and the lower DBR 43. A part of the amplified light L2 is output to the outside of the housing 10 through the window 13.

The resonator length is controlled by adjusting the gap G. Therefore, the wavelength of the output light L2 can be controlled by the operation of the MEMS mechanism 50. When a drive voltage is applied between the fixed electrode 51 and the movable electrode 55, electrostatic force according to the drive voltage acts between the fixed electrode 51 and the movable electrode 55. With the electrostatic force, the upper DBR 60 is displaced downward, and the size of the gap G is reduced. Therefore, by controlling the size of the gap G, that is, by controlling the drive voltage, the light L2 having a desired wavelength can be obtained.

For example, in a case where the central portion 58b in the movable film 58 has 200 µm in diameter and 3 µm in thickness, and the connection portion 58c has 50 µm in width and 200 µm in length, the resonance frequency is about 50 kHz. The amount of displacement of the upper DBR 60 by the MEMS mechanism 50 at this time is about 1 µm. When the variable resonator length with the upper DBR 60 is 2λ where the design wavelength λ is 2.3 µm, the thickness of the active layer 45 is 1.2 µm, and the effective refractive index is 3.9, the wavelength variable amount for the maximum variable amount 1 µm of the upper DBR 60 in m=8 (8th order) is 250 nm.

When the wavelength variable light source 1 is being operated, the excitation light source 30 and the gain medium 40 tend to generate heat. For example, if the MEMS mechanism 50 is thermally affected by the heat generation of the gain medium 40, the MEMS mechanism 50 may not be able to control the gap G with its original accuracy. That is, the movable film 58 may expand or deform due to the thermal influence. In this case, the gap G may be changed as the movable film 58 bends. In this case, even if the drive voltage is applied between the fixed electrode 51 and the movable electrode 55, the movable film 58 may not be easily displaced.

In the wavelength variable light source 1 according to the present embodiment, both the excitation light source 30 and the gain medium 40 are disposed on the heat sink 20. Therefore, not only the excitation light source 30 but also the gain medium 40 is directly cooled by the heat sink 20. With the configuration, the thermal influence on the MEMS mechanism 50 disposed on the gain medium 40 is suppressed. Therefore, the wavelength variable light source 1 is stably operated.

With the reflector 70, both the excitation light source 30 and the MEMS mechanism 50 is disposed on the heat sink 20. Therefore, wiring of electrodes is easily configured and assembly is easy and the size is easily decreased. For example, if the inclination angle of the inclined surface 13a is 7° and the distance from the element (the excitation light source 30 or the upper DBR 60) to the reflector 70 is 10 mm, the distance between the elements can be set to 2.5 mm. In this case, the heat sink can be formed into a 5 mm square, the TO-8 package is used as the housing, for example.

The reflector 70 is configured from a multilayer film formed in the window 13. This multilayer film has wavelength selectivity to transmit the light L2 output from the gain medium 40. Therefore, it is not necessary to additionally dispose a mirror or the like for reflecting the excitation light L1, and the elements is easily accommodated in the small housing.

The window 13 has the inclined surface 13a inclined with respect to the optical axis of the excitation light L1 output from the excitation light source 30. Therefore, the angle of the reflector (multilayer film) 70 is adjusted by a simple method such as angle adjustment of the window 13, and the excitation light L1 is reliably input to the gain medium 40.

By using a photonic crystal surface emitting laser having a small emission angle spread as the excitation light source 30, there is no need to separately dispose a lens or the like for condensing the excitation light L in the housing 10. Therefore, the elements are more easily accommodated in the small housing.

Since the upper DBR 60 is formed on the upper surface 58d of the movable film 58, the width of the gap G is freely designed without considering the thickness of the upper DBR 60.

Second Embodiment

In a wavelength variable light source 100 according to the present embodiment, a form of a heat sink is different from that of the wavelength variable light source 1 of the first embodiment. Hereinafter, different points from the first embodiment will be mainly described, and the same elements and members are denoted by the same reference numerals, and a detailed description thereof is omitted.

Figure 4:
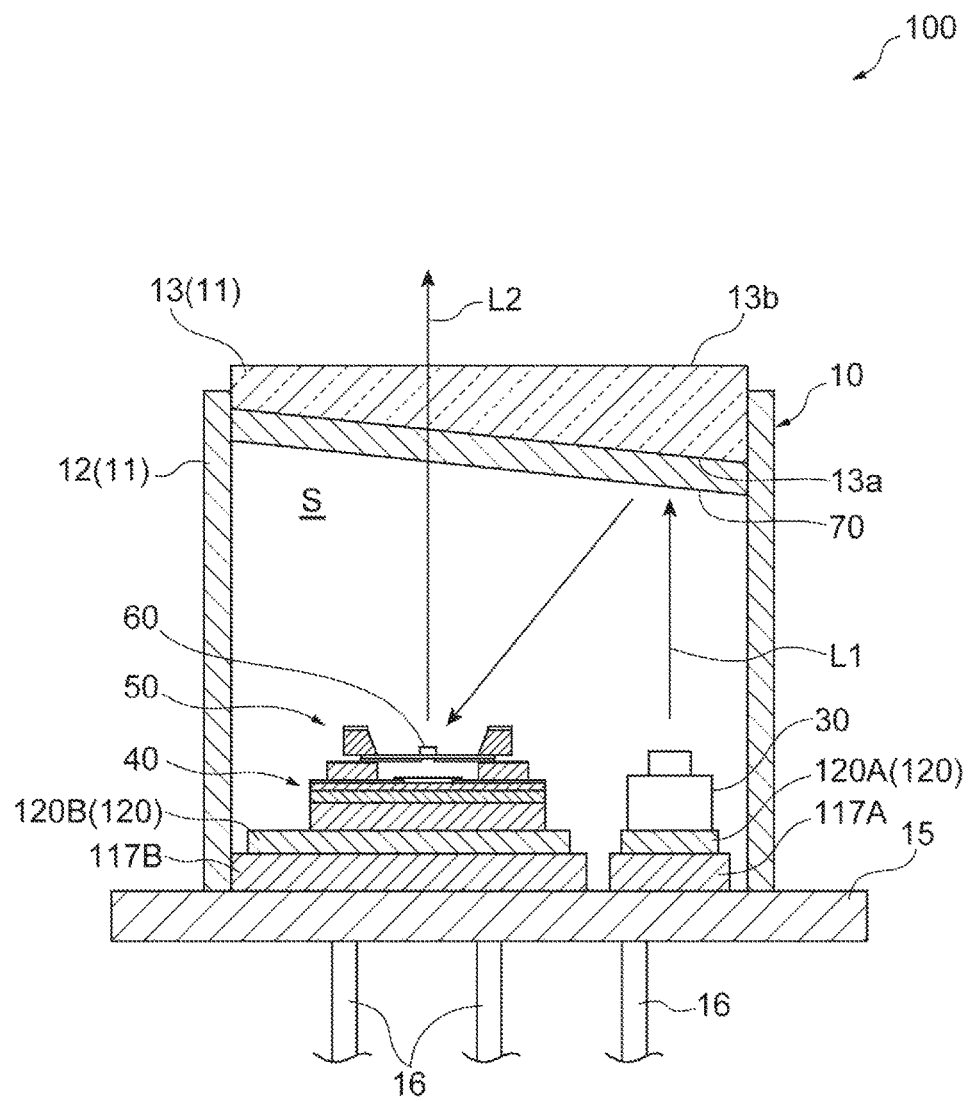
FIG. 4 is a schematic sectional view illustrating a wavelength variable light source according to a second embodiment.

FIG. 4 is a sectional view illustrating a wavelength variable light source according to the second embodiment. A wavelength variable light source 100 includes a housing 10, a heat sink 120, an excitation light source 30, a gain medium 40, a MEMS mechanism 50, an upper DBR 60, and a reflector 70.

The heat sink 120 has a first portion 120A and a second portion 120B separated from each other. The first portion 120A and the second portion 120B are disposed on a stem 15 in the housing 10. In the present embodiment, a TEC 117A and a TEC 117B separated from each other are disposed on the stem 15. The first portion 120A is disposed on the TEC 117A. The second portion 120B is disposed on the TEC 117B. The TEC 117A is operated by power supplied from lead pins 16 and cool the first portion 120A. Further, the TEC 117B is operated by the power supplied from the lead pins 16 and cool the second portion 120B. The excitation light source 30 is disposed on the first portion 120A. Further, the gain medium 40 is disposed on the second portion 120B.

With such a configuration, the temperature of the gain medium 40 is independently stabilized without being affected by heat generation of the excitation light source 30. As a result, stable laser oscillation and wavelength swapping is realized. In particular, in a case where the excitation light source 30 is a watt-class high output LD, the heat generation of the excitation light source 30 becomes very large. Therefore, by separately cooling the excitation light source 30 and the gain medium 40, thermal influence is more effectively suppressed.

Third Embodiment

In a wavelength variable light source according to the present embodiment, configurations of an excitation light source and a reflector are different from those of the wavelength variable light source of the first embodiment. Hereinafter, different points from the first embodiment will be mainly described, and the same elements and members are denoted by the same reference numerals, and a detailed description thereof is omitted.

Figure 5:
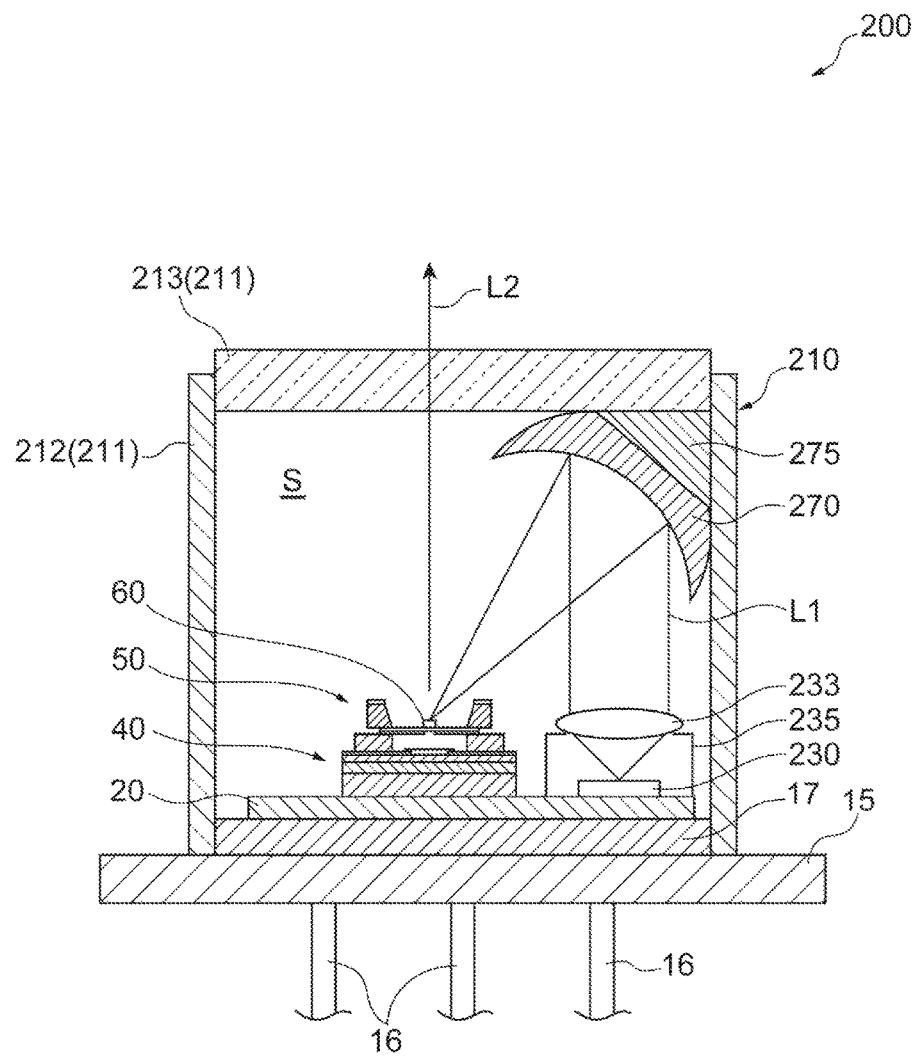
FIG. 5 is a schematic sectional view illustrating a wavelength variable light source according to a third embodiment.

FIG. 5 is a sectional view illustrating a wavelength variable light source according to the third embodiment. As illustrated in FIG. 5, a wavelength variable light source 200 includes a housing 210, a heat sink 120, an excitation light source 230, a gain medium 40, a MEMS mechanism 50, an upper DBR 60, and a reflector 270.

The housing 210 accommodates the heat sink 20, the excitation light source 230, the gain medium 40, the MEMS mechanism 50, the upper DBR 60, and the reflector 270 in a space S formed inside the housing 210. In the present embodiment, the housing 210 includes a cap 211 and a stem 15. The cap 211 includes a cylindrical portion 12 having a cylindrical shape and a window 213 that seals one end (upper end) of the cylindrical portion 12. The window 213 transmits light L2 output from the gain medium 40. For example, the window 213 can be formed of a material such as glass, quartz, or Ge.

The excitation light source 230 is disposed on the heat sink 20. The excitation light source 230 is so-called a typical edge emitting LD. Therefore, a spread angle of excitation light L1 of the excitation light source 230 is several tens of degrees. An aspheric lens 233 for collimating the excitation light L1 is disposed above the excitation light source 230. The aspheric lens 233 is supported on an optical path of the excitation light L1 by a support frame 235 disposed on the heat sink 20.

The reflector 270 reflects the excitation light L1 output from the excitation light source 230 toward the gain medium 40 in the housing 210. In the present embodiment, the reflector 270 is configured from a parabolic mirror. For example, the reflector 270 is supported by a support member 275 fixed to the cylindrical portion 12 and the window 213. The reflector 270 condenses the excitation light L1, which has passed through the aspheric lens 233 and becomes parallel light, toward the gain medium 40.

In the present embodiment, there is no need to make the window 213 of the housing 210 have a wedge structure. Further, there is no need to form a multilayer film selectively reflecting the excitation light in the window 213.

The embodiments have described in detail with reference to the drawings. However, specific configurations such as materials, sizes, and shapes are not limited to the above embodiments.

For example, although the example in which the entire inner surface of the window 13 is formed with the inclined surface 13a has been described, the present invention is not limited to the example. The inclined surface 13a may form only a part of the inner surface of the window 13.

Further, in the embodiments, mutual configurations may be replaced or added. For example, the heat sink 20 and the TEC 17 in the third embodiment may be replaced with the heat sink 120 and the TEC 117 in the second embodiment. Further, for example, a multilayer film configuring the reflector in the first embodiment may be formed on the inner surface of the window 213 in the third embodiment.

According to the wavelength variable light source of one aspect of the present disclosure, the thermal influence is suppressed and the stable operation is obtained.

What is claimed is:
1. A wavelength variable light source comprising:
a housing;
a heat sink disposed in the housing;
an excitation light source disposed on the heat sink and configured to output excitation light;
a gain medium disposed on the heat sink and including an active layer and a lower DBR;

a MEMS mechanism including a movable film facing the gain medium via a gap, the MEMS mechanism is disposed on the gain medium, and configured to control the gap;
an upper DBR provided on the movable film and configuring a resonator together with the lower DBR;
a reflector configured to reflect the excitation light output from the excitation light source toward the gain medium in the housing; and
a window formed in the housing and configured to transmit light output from the gain medium, wherein
the reflector is configured from a multilayer film formed on an inner surface of the window,
the multilayer film has wavelength selectivity to transmit the light output from the gain medium,
the excitation light source is a photonic crystal surface emitting laser, and
the window seals one end of the housing.

2. The wavelength variable light source according to claim 1, wherein
the heat sink has a first portion and a second portion separated from each other,
the excitation light source is disposed on the first portion, and
the gain medium is disposed on the second portion.

3. The wavelength variable light source according to claim 1, wherein
the window has an inclined surface inclined with respect to an optical axis of the excitation light output from the excitation light source, and
the multilayer film is formed on the inclined surface.

4. The wavelength variable light source according to claim 1, wherein
the upper DBR is formed on a surface of the movable film, the surface being at an opposite side of a surface facing the lower DBR.

* * * * *